United States Patent
Kunihiro

(10) Patent No.: US 9,236,838 B2
(45) Date of Patent: Jan. 12, 2016

(54) POWER AMPLIFICATION DEVICE

(75) Inventor: Kazuaki Kunihiro, Tokyo (JP)

(73) Assignee: NEC CORPORATION, Tokyo (JP)

( * ) Notice: Subject to any disclaimer, the term of this patent is extended or adjusted under 35 U.S.C. 154(b) by 69 days.

(21) Appl. No.: 14/346,577

(22) PCT Filed: Sep. 13, 2012

(86) PCT No.: PCT/JP2012/074124
§ 371 (c)(1),
(2), (4) Date: Mar. 21, 2014

(87) PCT Pub. No.: WO2013/042754
PCT Pub. Date: Mar. 28, 2013

(65) Prior Publication Data
US 2014/0218104 A1    Aug. 7, 2014

(30) Foreign Application Priority Data
Sep. 23, 2011    (JP) .................... 2011-208259

(51) Int. Cl.
*H03F 3/38*    (2006.01)
*H03F 3/217*    (2006.01)
(Continued)

(52) U.S. Cl.
CPC ............ *H03F 3/2171* (2013.01); *H03F 1/0277* (2013.01); *H03F 3/211* (2013.01); *H03F 3/72* (2013.01); *H03F 2200/204* (2013.01); *H03F 2200/336* (2013.01); *H03F 2200/537* (2013.01); *H03F 2200/541* (2013.01);
(Continued)

(58) Field of Classification Search
CPC ................... H03F 3/38; H03F 3/217
USPC .......................... 330/10, 251, 207 A
See application file for complete search history.

(56) References Cited

U.S. PATENT DOCUMENTS 4,580,111 A    4/1986 Swanson
6,396,340 B1 *    5/2002 Schmitt et al. ................. 330/10
(Continued)

FOREIGN PATENT DOCUMENTS

JP    10-84224 A    3/1998
JP    2002-9637 A    1/2002
(Continued)

OTHER PUBLICATIONS

Wang, Y., "An Improved Kahn Transmitter Architecture Based on Delta-Sigma Modulation", 2003 IEEE MTT-S International Microwave Symposium Digest, Jun. 8-13, 2003, vol. 2, 8 total pages, IEEE Cat. No. 03CH37411, ISSN: 0149-645X.
(Continued)

*Primary Examiner* — Henry Choe
(74) *Attorney, Agent, or Firm* — Sughrue Mion, PLLC

(57) ABSTRACT

An object of the present invention is to provide a power amplification device having high power efficiency for an input signal even in a power region in a large back-off.
A power amplification device of the present invention includes a delta-sigma modulator which performs a multi-level delta sigma modulation on amplitude signals of input signals, a plurality of power amplifiers which amplify carrier signals, an encoder which generates a first control signal that controls ON/OFF of the outputs from said plurality of power amplifiers in accordance with the output from said delta-sigma modulator, and a combiner which combines at least two power output from said plurality of power amplifiers in accordance with said first control signal.

8 Claims, 12 Drawing Sheets

(51) Int. Cl.
*H03F 1/02* (2006.01)
*H03F 3/21* (2006.01)
*H03F 3/72* (2006.01)

(52) U.S. Cl.
CPC ............ *H03F 2203/21106* (2013.01); *H03F 2203/21136* (2013.01); *H03F 2203/21142* (2013.01); *H03F 2203/7215* (2013.01); *H03F 2203/7236* (2013.01)

(56) References Cited

U.S. PATENT DOCUMENTS

| | | | |
|---|---|---|---|
| 6,639,462 B1 * | 10/2003 | Luu | 330/51 |
| 7,786,913 B2 * | 8/2010 | Waheed et al. | 341/143 |
| 2007/0189417 A1 * | 8/2007 | Waheed et al. | 375/300 |

FOREIGN PATENT DOCUMENTS

| | | |
|---|---|---|
| JP | 2007-235383 A | 9/2007 |
| WO | 2011/070952 A1 | 6/2011 |

OTHER PUBLICATIONS

Dupuy et al., "High Efficiency Power Transmitter Based on Envelope Delta-Sigma Modulation (EDSM)", 2004 IEEE 60th Vehicular Technology Conference—Wireless Technologies for Global Security, Sep. 26-29, 2004, vol. 3, 7 total pages, IEEE Cat. No. 04CH37575, ISSN: 1090-3038.

* cited by examiner

POWER AMPLIFICATION DEVICE

CROSS REFERENCE TO RELATED APPLICATIONS

This application is a National Stage of International Application No. PCT/JP2012/074124 filed Sep. 13, 2012, claiming priority based on Japanese Patent Application No. 2011-208259 filed Sep. 23, 2011, the contents of all of which are incorporated herein by reference in their entirety.

TECHNICAL FIELD

The present invention relates to a power amplification device which is mainly used for a transmitter of wireless communication.

BACKGROUND ART

As a digital modulation system used for wireless communication in recent years such as a cellular phone and a wireless LAN (Local Area Network), modulation scheme such as QPSK and multilevel QAM are employed. QPSK is an abbreviation of Quadrature Phase Shift Keying, and QAM is an abbreviation of Quadrature Amplitude Modulation.

In these modulation schemes, generally, signals locus forms amplitude modulation when symbol transitions occur. Accordingly, the amplitude (envelope) of a modulation signal superimposed on a carrier signal of a microwave bandwidth varies over time. The ratio of the peak power to the average power of the modulation signal is referred to as PAPR (Peak-to-Average Power Ratio).

When a signal having a large PAPR is amplified, a power supply device needs to supply sufficiently large power to an amplifier so as to prevent the waveform from being distorted with peak power in order to secure high linearity.

In other words, the amplifier needs to be operated in a large back-off power region that is sufficiently lower than the saturated output power restricted by the power supply voltage.

Generally, because linear amplifiers operating in class A or class B have maximum power efficiency nearly at the saturated output power, if the linear amplifiers are operated in the large back-off region, their average power efficiency lowers.

In an orthogonal frequency division multiplex (OFDM) system using a multi carrier adopted in the next-generation mobile phones, wireless LANs and digital television broadcasts, the PAPR thereof tends to increase. Accordingly, the average efficiency of the amplifier further lowers. Note that OFDM is an abbreviation of Orthogonal Frequency Division Multiplexing.

Therefore, an amplifier has a characteristic of high power efficiency in the large back off power region is desired.

As a system that amplifies a signal in the large back-off region and with wide dynamic range and high efficiency, a power amplification device of a digital amplitude modulation system is disclosed in Patent Document 1, for example. FIG. 10 is a diagram showing a configuration of a power amplification device disclosed in Patent Document 1. As shown in FIG. 10, an amplitude signal 1050 is converted by a digitizer 1005 (A/D (Analog/Digital) converter) into n-bit digital signals 1061, 1062 . . . and 106n. The converted digital signals are inputted to n class D switching amplifiers 1011 and 1012 . . . and 101n. The class D switching amplifier amplifies a carrier signal 1052 from a RF source 1010 based on a digital signal. When logic of the digital signal which is an output of the digitizer 1005 is in High, the class D switching amplifier outputs a signal amplified by the class D switching amplifier to a power combiner 1002. When logic of the digital signal which is an output of the digitizer 1005 is in Low, an output of the class D switching amplifier is grounded.

The power combiner 1002 includes transformers 1021, 1022 . . . and 102n connected in series, and adds the output voltages of the class D switching amplifiers 1011, 1012 . . . and 101n. The voltage added signal is supplied to a load.

A block diagram of a class D switching amplifier of full bridge type which is an example of the class D switching amplifier is shown in FIG. 3. Two FETs (Field Effect Transistors) 1a and 1b and two FETs 1c and 1d which are stacked for connection are connected in parallel. One terminal of the two FETs is grounded, and the other terminal thereof is connected to a common power supply VDD.

By inputting a carrier signal 52 (S1) and an opposite phase signal (S2) thereof as shown in FIG. 3, when S1 is in High and S2 is in Low, the power supply voltage VDD appears in an output. When S1 is in Low and S2 is in High, the polarity of the output reverses, and −VDD appears. This operation is repeated and the inputted carrier signal is amplified to a signal of 2×VDD by the voltage magnitude. At that time, because the respective FETs are performing switching operation and an overlap does not occur in waveforms of current and voltage, power loss is not generated in the FETs, and amplifying with very high efficiency.

In the full bridge type class D switching amplifier shown in FIG. 3, when inputs S1 and S2 of low side FETs 1b and 1d are set to in High, respectively, and inputs S1 and S2 of high side FETs 1a and 1c are set to in Low, respectively, a voltage does not generate in an output, and the output will be in a grounding state. For example, this operation can be realized by controlling the switches 111-114 of FIG. 3.

FIG. 10 is an example in which the full bridge type class D switching amplifier shown in FIG. 3 is applied as an amplifier of a digital amplitude modulation system amplifier. When digital signals 1061, 1062 . . . and 106n are High, a carrier signal and an opposite phase signal thereof are inputted to S1 and S2 respectively. On the other hand, when digital signals 1061, 1062 . . . and 106n are Low, an output will be in the grounding state by controlling the switches 111-114. By performing voltage addition of the output with transformers 1021-102n of FIG. 10, a carrier signal to which amplitude modulation is performed can be amplified with high efficiency is possible, and can be outputted to a load.

An amplifier of a digital amplitude modulation system of such a system is utilized in a medium wave radio transmitter, and high efficiency beyond 80% is realized.

However, when a digital modulation system amplifier shown in FIG. 10 is applied to a high frequency equal to or greater than a VHF (Very High Frequency) band, two problems arise.

The first problem is caused by parasitic capacitance Cp in the FET which composes the class D switching amplifier shown in FIG. 3. That is, when the switching frequency f becomes high, power loss of the magnitude $Cp \cdot V^2 \cdot f$ (V is voltage magnitude applied to the FET) will generate. In other words, because the magnitude of the power loss is proportional to the frequency f, when the frequency f becomes high, power loss cannot be ignored any more, and high power efficiency cannot be maintained.

The second problem is loss in transformers 1021, 1022 . . . and 102n which perform voltage addition as a power combiner. This loss cannot also be ignored any more in a high frequency domain. In particular, when a handled power is large like a base station of a mobile phone and a broadcasting station, it is difficult to realize a low-loss transformer in a high frequency domain due to the nature of a transformer.

A method to solve this problem is disclosed by patent document 2 for example. FIG. 11 is a diagram of a configuration disclosed by patent document 2.

In this system, as shown in FIG. 11, a modulated analog signal generated by a modulation signal generator 1108 is inputted to an A/D converter 1105, and is converted into a digital modulation signal. After that, the digital modulation signal is inputted to an on/off controller 1106 and converted into a control signal for turning ON/OFF (switching) four switches SW1-SW4.

Here, an example in case there are four switches SW1-SW4 is shown. There are four switches because the four switches correspond to 4 bits which are the quantifying bit numbers of the output digital signal of the A/D converter 1105.

The above-mentioned control signal switches the switches SW1-SW4 in order to correspond to respective bits. The switches SW1-SW4 receive carriers generated by a carrier generator 1110 as input signals, and input the input carriers to the power amplifiers PA1-PA4, corresponding to a period currently controlled by ON.

The power amplifiers PA1-PA4 have weighted output levels, respectively for correspondence in each bit of the 4-bit digital signal.

For example, the power amplifier PA1 has an amplification degree proportional to $2^3$ corresponding to a most significant bit (MSB) of the 4-bit digital signal. Similarly, the power amplifiers PA2, PA3 and PA4 have an amplification degree proportional to $2^2$, $2^1$ and $2^0$, respectively.

Power combining of respective output signals of the power amplifiers PA1-PA4 is performed by power combiners 1121, 1122 and 1123 provided corresponding thereto. The configuration of the power combiners 1121, 1122 and 1123 are common. That is, the power combiners 1121, 1122 and 1123 include two 3 dB couplers, a variable phase shifter and a 90° phase shifter. A diagram illustrating operation of the 3 dB coupler is shown in FIG. 8. When a signal with which 90° phase shifted in an equal amplitude (for example, magnitude is set as "1") is inputted to the 3 dB coupler, the combined power (magnitude "2") appears in an output terminal, and a power does not occur in a dummy resistor connected to an isolation terminal (magnitude "0"). That is, the 3 dB coupler can combine the power without power loss.

Next, operation of a power combiner shown in FIG. 11 is described in an example of the power combiner 1121.

According to the arbitrary bit state, a signal of the different amplitude is generally inputted to the power combiner 1121. In this case, two outputs which appear from the first 3 dB coupler M1 are equal in the intensity of the voltage vector but different in the phase. When the phases of these two signals are set to x° and y°, a voltage signal whose phase is arranged to −45° in an equal amplitude is obtained by rotating the phases only by $+\{(y°-x°)/2\}$ and $-\{(y°-x°)/2\}$ using phase shifters PH11 and PH12 respectively.

Two signals whose phases are shifted by 90° each other in an equal amplitude can be obtained by delaying the phase of one of the signals by 90° with the phase shifter SH1. By inputting the two signals to the second 3 dB coupler M2, the combined power appears in an output terminal, and a power does not occur in a dummy resistor R1. That is, the two signals can be combined without loss.

By performing the same operation by power combiners 1122 and 1123, and connecting the power combiners 1122 and 1123 in series, power according to the arbitrary bit state can be combined without loss.

Phase shifting of the phases of the carrier signals inputted into SW1-SW4 is performed in advance to −270°, −135°, 0° and 0°, respectively by phase devices φ1, φ2, φ3 and φ4 in order to arrange the phases of the carrier signals. After that, each of carrier signals are inputted to the amplifiers PA1, PA2, PA3 and PA4, respectively.

An advantage of this system compared with the system of FIG. 10 is that the system does not need to use a class D switching amplifier like FIG. 3, and high frequency operation becomes possible by using amplifiers of class A, class B or class C which operates as a current source. Because each of the power combiners connected to respective power amplifiers are insulated, when the amplifiers are in the on/off state, the output impedance does not need to be 0. That is, the amplifier does not need to be a voltage source. Because the amplifiers of class A, class B, or class C do not have a problem of power loss in a high frequency region as described above, high frequency operation becomes possible by using these amplifiers.

High frequency operation is also possible for a 3 dB coupler including a transmission line. Moreover, in this system, linearity of the whole amplification device does not depend on linearity of each amplifier, and each amplifier can perform only saturated operation. Accordingly, a class B-C amplifier which has high saturated efficiency can be employed as each amplifier. High efficiency can be obtained compared with a case where an amplifier which operates as a current source is used independently.

The number of the power amplifiers which operate in a small amplitude domain decreases in this system on the operating principle, and each amplifier is operating with a saturated efficiency. Accordingly, an output modulation signal amplified with high efficiency and a back off is obtained as a result.

In the related technologies of patent document 1 and patent document 2 shown in FIG. 10 and FIG. 11, the precision in an amplitude direction is decided by the number of the amplifiers, that is, the number of bits of the AD converter.

However, a signal with large PAPR is used in wireless communications such as a mobile phone, a wireless LAN, and terrestrial digital broadcasting in recent years. Therefore, the large number of bits is needed in order to obtain the desired SN ratio. For example, a digital signal of 12-14 bits is used for a signal from a baseband in a base station of a mobile phone. In order to realize the same SN (Signal to Noise) ratio in the related technology described in patent documents 1 and 2, power amplifiers of the same number (twelve to fourteen) need be installed.

In contrast, a related technology which reduced the number of the power amplifiers is disclosed in non-patent documents 1 and 2. In these technologies, delta-sigma modulation is applied to a signal (an output of an Envelope Detector) which detected an amplitude component of an input modulation signal, and the result thereof is multiplied by a phase modulation signal (an output of Limiter and TimeDelay) of an input modulation signal. The output signal is inputted to a switching amplifier (1 bit amplifier), and output the RF output via a filter. In this configuration, the class D switching amplifier which performs switching operation is only one in a power amplifier.

THE PRECEDING TECHNICAL LITERATURE

Patent Document

[Patent document 1] U.S. Pat. No. 4,580,111
[Patent document 2] Japanese Patent Application Laid-Open No. 1998-084224

Non-Patent Literature

[Non-patent literature 1] Wang, 2003 IEEE MTT-S International Microwave Symposium Digest, Pages: 1327-1330 vol. 2
[Non-patent literature 2] Wang, 2004 IEEE 60-th Vehicular Technology Conference, Pages: 2092-2095 Vol. 3

SUMMARY OF INVENTION

Technical Problem

As mentioned above, in the related technology of patent document 1 and patent document 2 shown in FIG. 10 and FIG. 11, the precision in an amplitude direction is decided by the number of the amplifiers, that is, the number of bits of the AD converter. Therefore, in order to realize the same SN ratio, power amplifiers of the same number (twelve to fourteen) need to be installed.

That is, in the related technology described in patent documents 1 and 2, there are the following problems.

The first problem is that the efficiency of the whole amplification device falls by a loss in a power combiner.

The reason is because the loss in a transformer of FIG. 10, or a power combiner such as a 3 dB coupler of FIG. 11 is not a zero. In particular, a loss cannot be ignored any more as frequency becomes high. Because respective combiners are connected in series, a loss per one stage of the power combiner will be added, and the loss becomes larger as a whole. In particular, in the related technology shown in FIG. 11, two 3 dB couplers are used per one stage of the power combiner. A variable phase-shifter is realized by changing a transmission line by the switch, and changing electrical length. Therefore, the loss in the switch is large, and when a power combiner becomes multiple stages, the loss therein cannot be ignored any more.

The second problem is that an amplitude-modulated precision degrades.

In the related technology described in FIG. 11, according to the state of the bit, the phase shift quantity of the variable phase-shifter inside the combiner needs to be changed. However, when the required number of bits increases as mentioned above, the phase-shift control becomes complicated. Therefore, a shift of a phase control amount tends to generate and the shift of the phase control amount leads to a deterioration of an amplitude modulation precision.

Although the number of the power amplifier is one in the related technology disclosed in non-patent document 1 and non-patent document 2, there is a following problem.

That is, in the configuration of this related technology, the precision in an amplitude direction is decided by an over-sampled ratio of the delta sigma modulator. In a mobile phone, a wireless LAN and high-speed wireless communication of a terrestrial digital broadcasting in recent years, a high oversampled ratio is needed in order to obtain a desired SN ratio. An oversampled ratio is a ratio indicating by what times of a general sample frequency (two times of a frequency component of a signal) is sampled (oversampled). For example, in a base station of a mobile phone, a digital signal of 12-14 bits is used for a signal from a baseband. In order to realize the same SN ratio by one bit, in a delta sigma modulator, several hundred times as many over-samples are needed. Accordingly, to a signal of about 20 MHz bands for such as a portable base station and a wireless LAN, a sampling clock of several GHz or more will be needed. However, it is very difficult to realize a very high-speed delta sigma modulator shown in the related technology. Because an operating frequency is very high even if such a very high-speed delta sigma modulator shown in the related technology can be realized, there is a problem that the power consumption will become very large.

In the related technology, a switching amplifier of an output stage is also switched at high speed. In the switching amplifier, as mentioned above, when the parasitic capacitance is Cp, the amplitude is V and the switching frequency of a device is fsw, the loss of $Cp \cdot V^2 \cdot fsw$ will be generated. In other words, because the switching frequency fsw becomes large, there is also a problem that the loss is increased and the power efficiency of the switching amplifier degrades.

(Object of Invention)

An object of the present invention is to provide a power amplifier which solves the above-mentioned problems and has high power efficiency for an input signal even in a power region in a large back-off and can also suppress increasing of power consumption in high-speed communication.

Solution to Problem

A power amplification device of the present invention comprising:
a delta-sigma modulator which performs a multilevel delta sigma modulation on amplitude signals of input signals;
a plurality of power amplifiers which amplify carrier signals;
an encoder which generates a first control signal that controls ON/OFF of the outputs from said plurality of power amplifiers in accordance with the output from said delta-sigma modulator;
and a combiner which combines at least two power output from said plurality of power amplifiers in accordance with said first control signal A power amplification method of the present invention comprising:
performing multilevel delta-sigma modulation on amplitude signals of input signals;
controlling, in a plurality of power amplifiers which amplify carrier signals, ON/OFF of the outputs from the plurality of said power amplifiers in accordance with the output from the said delta-sigma modulation;
and combining at least two power output from the plurality of said power amplifiers on the basis of said controlling.

Advantageous Effects of Invention

According to the present invention, a power amplification device which solves the above-mentioned problems and has high power efficiency for a signal even in a power region in a large back-off and can also suppress increase of power consumption in high-speed communication can be provided.

DESCRIPTION OF EXEMPLARY EMBODIMENT

The present invention is not limited to following each exemplary embodiment, and can perform various changes in the range which does not deviate from a gist of the present invention.

(First Exemplary Embodiment)
(Configuration)

A configuration of a power amplifier of a first exemplary embodiment will be described.

Figure 1:
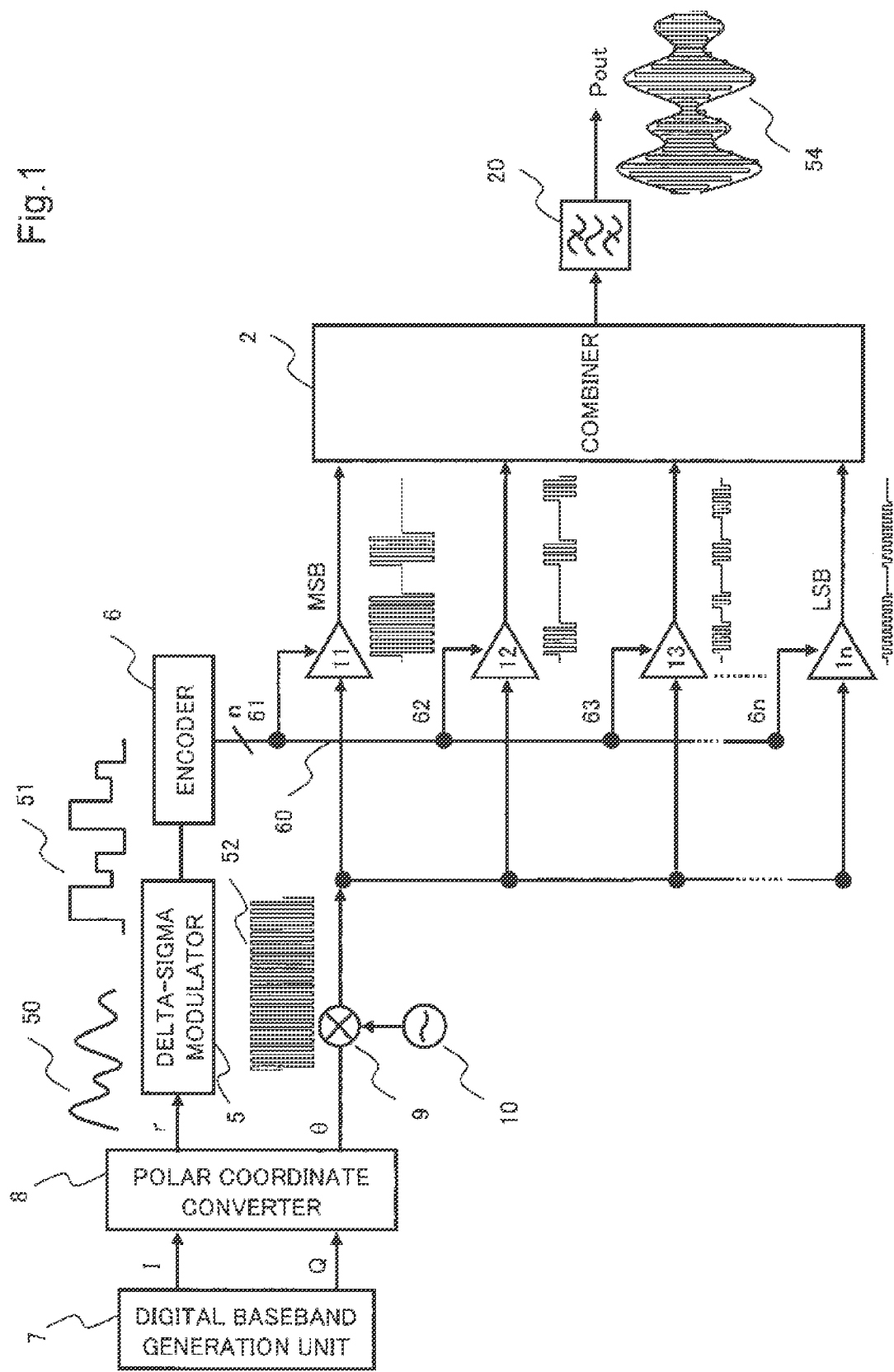
FIG. 1 is a block diagram showing a configuration of a first exemplary embodiment of the present invention.

FIG. 1 is a block diagram showing a configuration of a first exemplary embodiment of the present invention.

A digital baseband generation unit 7 outputs a complex signal (I, Q) of a signal to be transmitted. A polar coordinate converter 8 converts a complex signal (I, Q) into a polar coordinate signal (r, θ) and outputs. A delta-sigma modulator 5 performs multilevel delta-sigma modulation on an amplitude signal r 50, and outputs a pulse signal 51 having a plurality of discrete output levels. An encoder 6 converts the discrete output levels of the pulse signal 51 into the control signal 60 which is a digital signal of n bits and outputs. An MSB which is a most significant bit is inputted as a control signal 61, the next bit is inputted as a control signal 62, the further next bit is inputted as a control signal 63, and an LSB (Least Significant Bit) which is a least significant bit is inputted as a control signal 6n into power amplifiers 11, 12, ... and 1n sequentially among the control signals 60.

A local oscillator 10 generates local signals. A multiplier 9 multiplies a phase signal θ and a local signal together, and outputs a carrier signal 52 on which the phase signal is superposed.

The power amplifiers 11, 12, ..., and 1n perform ON/OFF operation based on the control signals 61, 62, ..., and 6n, amplify the carrier signal 52 on which the phase signal is superposed only during an ON period, and output. A combiner 2 combines the outputs from the amplifiers 11, 12, ..., and 1n, and outputs. A filter 20 inputs a signal combined in the combiner 2, and passes only a signal around the carrier frequency, and outputs.

Figure 3:
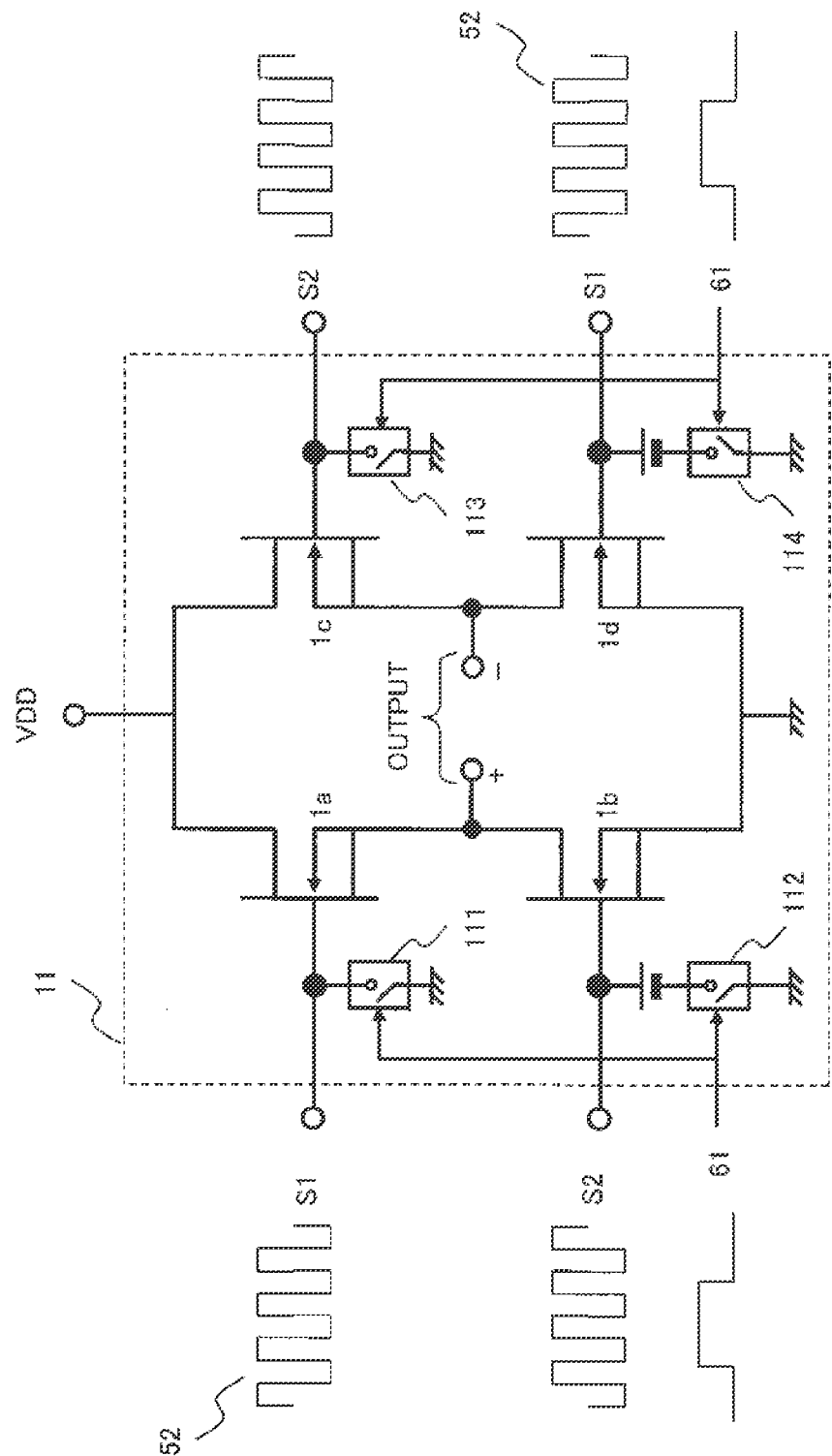
FIG. 3 is a diagram showing a specific configuration of a class D switching mode amplifier in the first exemplary embodiment of the present invention.

FIG. 3 is a diagram showing a specific configuration of a class D switching mode amplifier used for the power amplifier 11. FETs 1a, 1b, 1c and 1d perform switch operation based on control signals S1 and S2 inputted to the gates. The control signal S1 is a signal which synchronizes with the carrier signal 52. The control signal S2 is a signal which synchronizes with a reverse phase of the carrier signal 52. Switches 111, 112, 113 and 114 are controlled based on the control signal 61. The switches 111, 112, 113 and 114 are turned on when the control signal 61 is "1" (logical High), and are turned off when the control signal 61 is "0" (logical Low). When the switches 111, 112, 113 and 114 are turned on, the inputs of the FET 1b and the FET 1d will be in High and the inputs of the FET 1a and FET 1c will be in Low, and the output of the power amplifier 11 is grounded.

Figure 4:
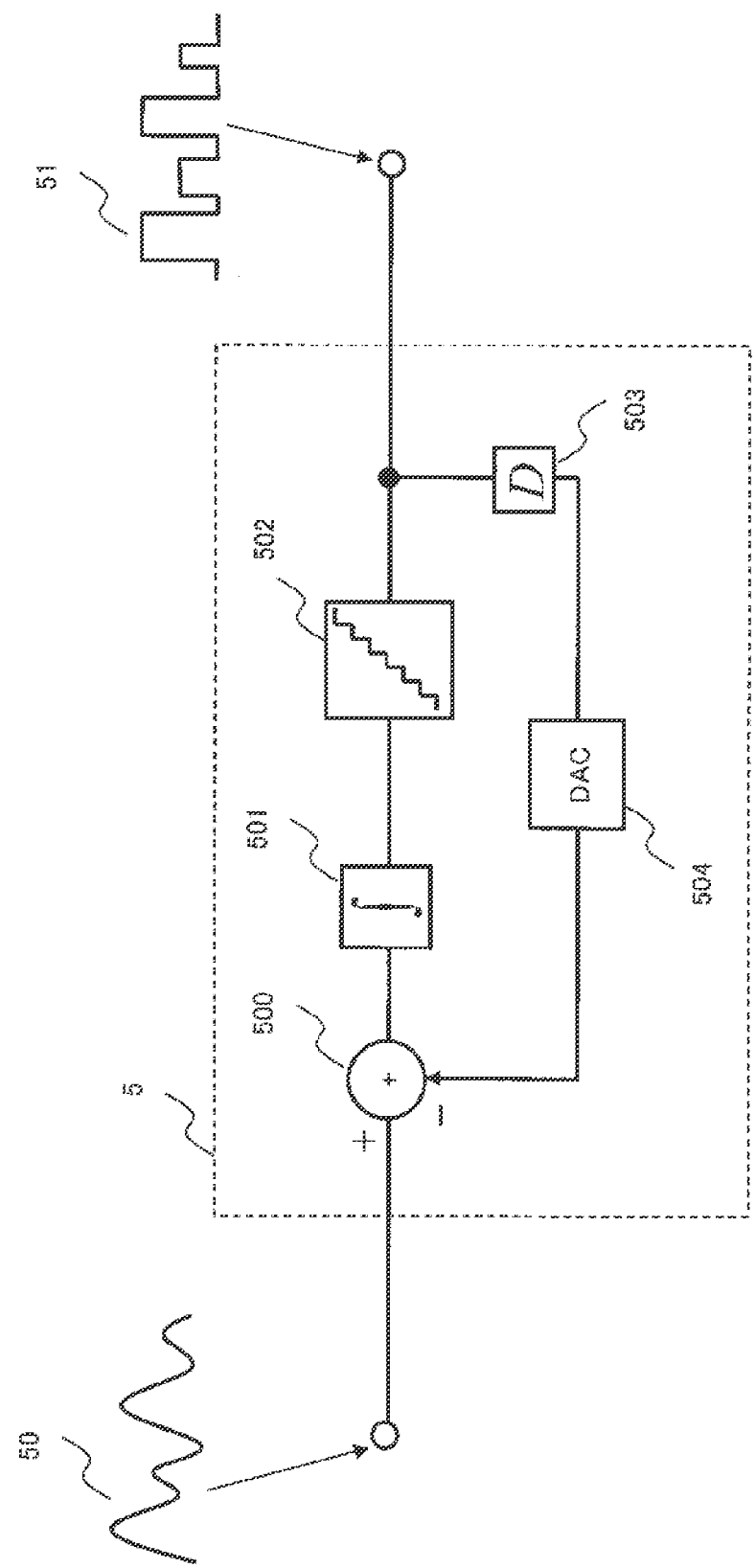
FIG. 4 is a block diagram showing a configuration of a multilevel delta-sigma modulator in the first exemplary embodiment of the present invention.

FIG. 4 is a block diagram showing a configuration of a multilevel delta-sigma modulator.

An amplitude signal 50 is subtracted an output from a DAC 504 in a subtractor 500. The subtracted result is inputted to an integrator 501. An output from the integrator 501 is inputted to a multilevel quantizer 502. An output from a multilevel quantizer 502 will be a pulse signal 51 having a plurality of discrete output levels of the multiple valued. This pulse signal 51 is inputted to the DAC 504 via a delay element 503.

(Operation)

Next, an amplification operation of the power amplification device of FIG. 1 will be described using FIG. 2 which is a more specific configuration of FIG. 1.

Figure 2:
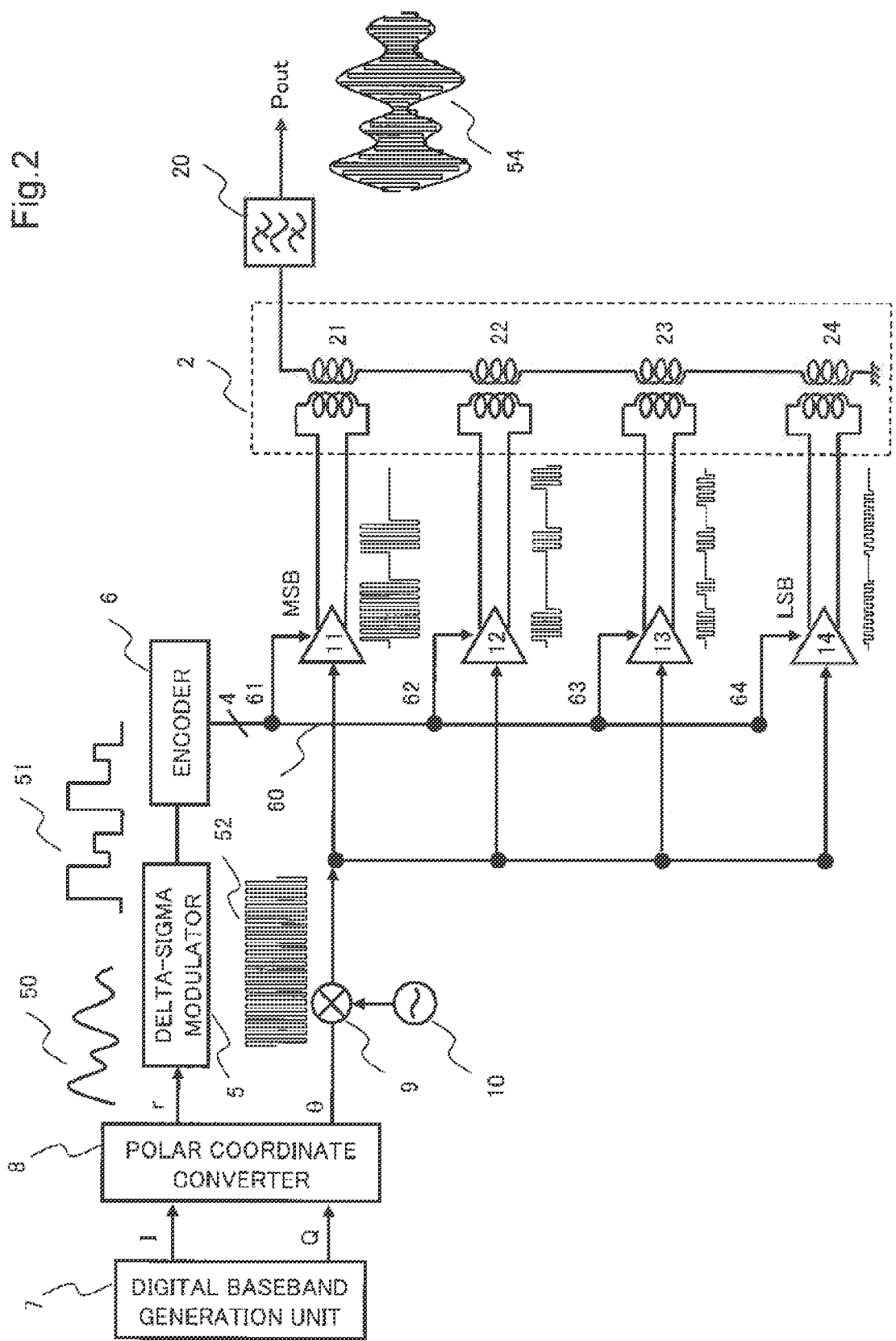
FIG. 2 is a block diagram showing a more specific configuration of the first exemplary embodiment of the present invention.

FIG. 2 is a block diagram showing a more specific configuration of the first exemplary embodiment. Here, for a simplification, using a case of 4 bits (n=4) is shown. However, the basic operation is the same for arbitrary bit numbers.

In a diagram, when the amplitude signal r 50 is inputted to the delta-sigma modulator 5, the delta-sigma modulator converts the amplitude signal r 50 into a pulse signal 51 having discrete output levels of $2^4=16$ valued (for example, the intensities of the output levels are 0, 1, ..., or 15).

The encoder 6 converts the discrete output levels of sixteen valued into the control signals 60 which are digital signals expressed by binary expression and composed of "1" and "0" of 4 bits. The MSB of the control signals 60 is inputted to the power amplifier 11 as a control signal 61. The LSB of the control signals 60 is inputted to the power amplifier 14 as a control signal 64. The power amplifiers 11, 12, 13 and 14 have output levels corresponding to the magnitude ($2^3$, $2^2$, $2^1$ and $2^0$) of respective bits of the control signal 60. ON and OFF of the output signals from the power amplifiers 11, 12, 13 and 14 is controlled based on the state of "1" and "0" of the control signals 61, 62, 63 and 64.

In order to output a signal with an output level corresponding to the magnitude of each bit, the power amplifier 11 is operated by the power supply voltage $VDD/2^0$, the power amplifier 12 is by the power supply voltage $VDD/2$, the power amplifier 13 is by the power supply voltage $VDD/2^2$, and the power amplifier 14 is by the power supply voltage $VDD/2^3$ respectively.

For example, when the output level of the pulse signal 51 is "15", as a control signal 60, (1, 1, 1, 1) is outputted. At that time, all power amplifiers 11, 12, 13 and 14 operate, amplify the carrier signals 52 and output to the combiner 2.

When the output level of the pulse signal 51 is "10", as a control signal 60, (1, 0, 1, 0) is outputted. At that time, only the power amplifiers 11 and 13 amplify the carrier signals 52 and output to the combiner 2, and the outputs of the power amplifiers 12 and 14 are grounded. The grounding is realized by, for example, controlling the switches 111-114 installed in the inputs of the transistors 1a-1d by the control signal 60 from the encoder 6 as shown in FIG. 3, and setting the inputs of the low side FETs 1b and 1d to "High", and the inputs of the high side FETs 1a and 1c to "Low". When the control signal 60 is in the other bit state, similar operation is performed.

The power combiner 2 includes transformers 21, 22, 23 and 24, and a primary side of each transformer is connected to an each output of the power amplifiers 11, 12, 13 and 14 respectively, and secondary sides thereof are connected in series. One end of the transformers connected in series is grounded, and other end thereof is connected to a filter 20.

The power combiner 2 has an action for adding the output voltages from respective power amplifiers. At that time, because the power amplifier in the off state is grounded, a voltage is not generated, and a signal to which the output voltage from the power amplifier in the on state is added is generated in an output terminal of the secondary side of the transformer. The added signal will be an output signal Pout via the filter 20.

In the above-mentioned exemplary embodiment, the power amplifiers 11, 12, 13 and 14 are operating as switches. Accordingly, a power loss by the product of a current and a voltage is not generated in the constituent transistors 1a, 1b, 1c and 1d, and high power efficiency can be realized. As a result, high power efficiency is also obtained in a back off area where the output power is smaller than the saturation power.

Figure 10:
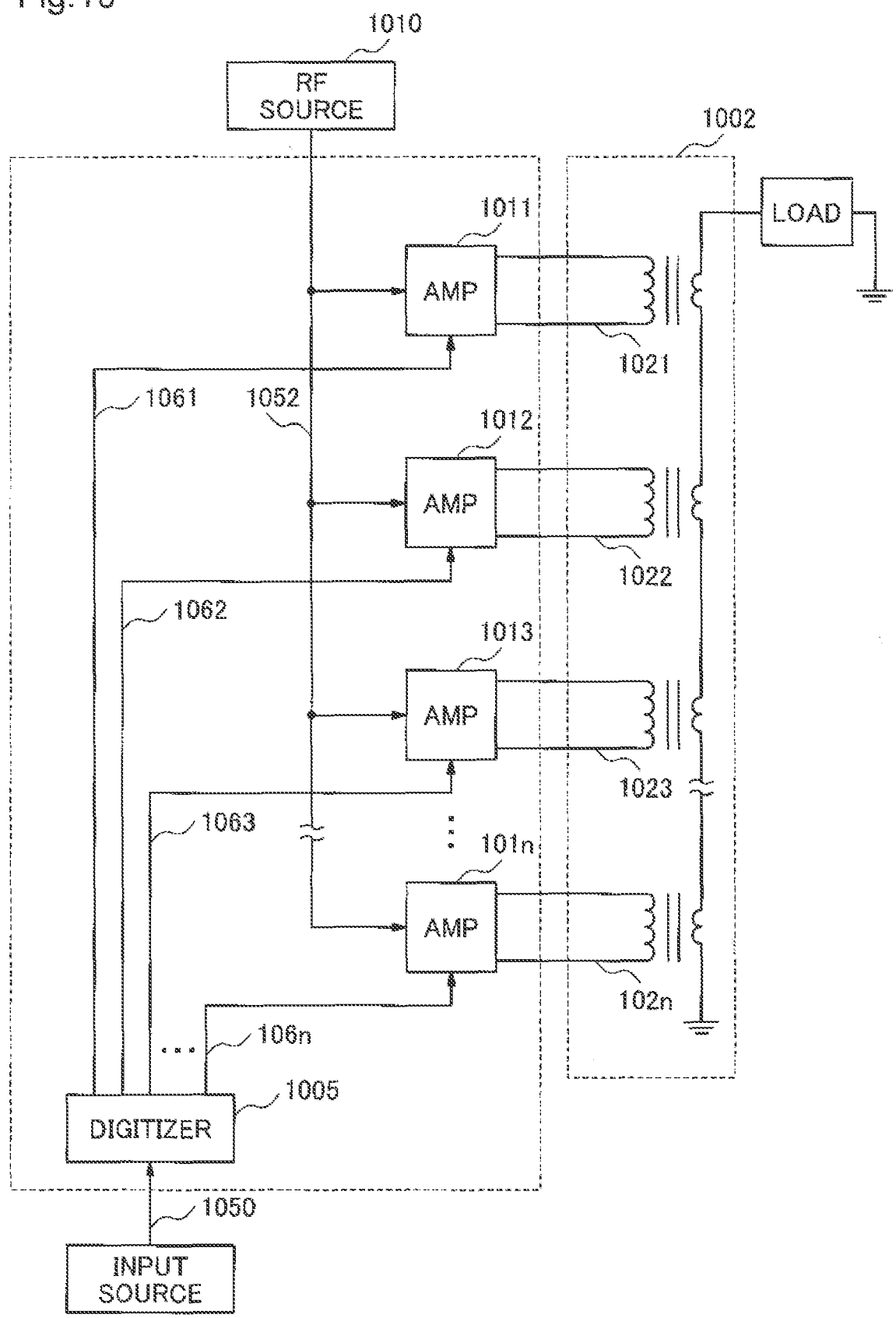
FIG. 10 is a block diagram showing a configuration of an amplifier of a digital modulation system which is a related art.

In the power amplifier of the related technology shown in FIG. 10, the intensity of the amplitude signal is expressed by only the number of the power amplifiers in the on state. In contrast, multilevel delta sigma modulation having a plurality of discrete output levels is performed on the amplitude signal in this exemplary embodiment. The delta-sigma modulator has the effect that the quantization noise level around the desired signal is lowered by applying oversampling to an input signal. Moreover, the delta-sigma modulator has the noise shaping effect that distributes quantization noise over a bandwidth which is separated from a desired signal. As a result, the SN ratio equal to the related technology can be realized by the number of the power amplifiers (=number of bits) less than the related technology. The reason is as follows. That is, in the power amplifier of the related technology which does not use a delta-sigma modulator, the amplitude signal is expressed only by the height of the pulse (=the number of the power amplifiers which operate). In contrast, in the above-mentioned exemplary embodiment, the amplitude signal is expressed by using a width of a pulse (=an operating time of a power amplifier) in addition to the height of the pulse. In other words, the amount of information (=number of bits) which should be expressed by the height of the pulse can be reduced for the part in which information is placed by a width of a pulse. Because the number of bits is the number of the power amplifiers, the number of the power amplifiers of the part that reduced the number of bits can be reduced.

For example, in order to obtain an SN ratio=70 dB necessary for WCDMA (Wideband Code Division Multiple Access), about at least 12 bits are needed. Accordingly, in the related technology shown in FIG. 10 and FIG. 11, twelve amplifiers are needed. Thereby, there occurs a problem that the number of combiners increases and a size of a device increases.

In contrast, in this exemplary embodiment, when 32 times oversampling to the WCDMA signal in 5 MHz band is performed by a 1st order delta-sigma modulator, an equivalent SN ratio can be realized by 4 bits. When a 2nd order delta-sigma modulator is used, the number of bits can be reduced further.

As a result of the reduction of the number of power amplifiers, when power of respective power amplifiers are combined, a power loss by a combiner can also be reduced, and high SN ratio and high power efficiency can be achieve.

Only a desired signal can be outputted by the noise shaping effect by the delta-sigma modulator after removing the quantization noise distributed over high frequency side in the filter 20 as necessary. The output of the delta-sigma modulator may be directly outputted without passing through a filter depending on a system.

Note that the functions of the polar coordinate converter 8, the delta-sigma modulator 5, and the encoder 6 shown in FIG. 1 and FIG. 2 may be composed as an individual block, or the functions of the polar coordinate converter 8, the delta-sigma modulator 5, and the encoder 6 shown in FIG. 1 and FIG. 2 may be integrated to compose as a part of the digital baseband generation unit 7. In this case, the amplitude signal 50 and the pulse signal 51 which is an output signal of the multilevel delta-sigma modulator are also expressed as digital signals.

Although the 1st order is assumed as the order of the delta-sigma modulator in this exemplary embodiment, the order of no smaller than 2nd can be selected arbitrarily according to the system.

In this exemplary embodiment, the output levels of the power amplifiers 11, 12, . . . , and 1n are given weight by $2^{n-1}$, $2^{n-1}$, . . . , and $2^0$. However, according to the system, the coding method with the encoder 6 and the weighting for each amplifier can be designed freely.

In this exemplary embodiment, the weighting for an output level (voltage) from a power amplifier is realized by changing a power supply voltage. However, the weighting for an output level (voltage) from a power amplifier may be realized by changing the number of turns of the transformers 21, 22, . . . , and 2n.

The effect of this exemplary embodiment is that a power amplifier with high efficiency and high linearity in a back off area can be provided.

The reason is as follows. The power amplification device of this exemplary embodiment includes a plurality of amplifiers with an amplification degree according to the magnitude of the input signal, and the number of the amplifier turned on is changed according to the output level. In the power amplification device of this exemplary embodiment, only amplifiers of requisite minimum operate according to the magnitude of the back off. Each amplifier can be operated by a switching mode with which a power loss by a product of a current and a voltage does not generate, or a class B amplifier can be operated at around the saturation range in which the power efficiency becomes the maximum. Accordingly, a high efficiency is maintained.

In the power amplification device of this exemplary embodiment, because a multilevel delta-sigma modulation is performed on the amplitude signal, high linearity can be realized by the small number of amplifiers (=number of bits). Accordingly, when power of respective amplifiers are combined, a power loss by a power combiner can also be reduced, and high linearity and high efficiency can be achieve.

The different effect of this exemplary embodiment is that a low-cost and small size power amplification device can be provided compared with a power amplifier of the related technology which performs digital modulation of an amplitude signal.

The reason is because the power amplification device of this exemplary embodiment can realize the same amplitude accuracy as the related technology by the number of bits less than the related technology by performing the multilevel delta-sigma modulation on an amplitude component. Therefore, the number of the power amplifiers and the power combiners that are expensive and large size can be reduced, and remarkable cost reduction and miniaturization of a power amplification device become possible.

This exemplary embodiment has the effect that a high requirement to the oversampling ratio for the delta-sigma modulator is eased by having multilevel delta sigma modulation, that is, by the multi-levelling of the delta-sigma modulator, and realization of a device is facilitated.

And the oversampling ratio can be lowered by having multilevel delta sigma modulation. That is, an oversampling frequency can be lowered. Accordingly, because an average switching frequency of a switching amplifier which is a power amplifier is also lowered, the effect that a degradation of the power efficiency of the switching amplifier can be suppressed is obtained.

(The Second Exemplary Embodiment)

(Configuration)

Next, a configuration of a receiving apparatus of a second exemplary embodiment is described.

Figure 5:
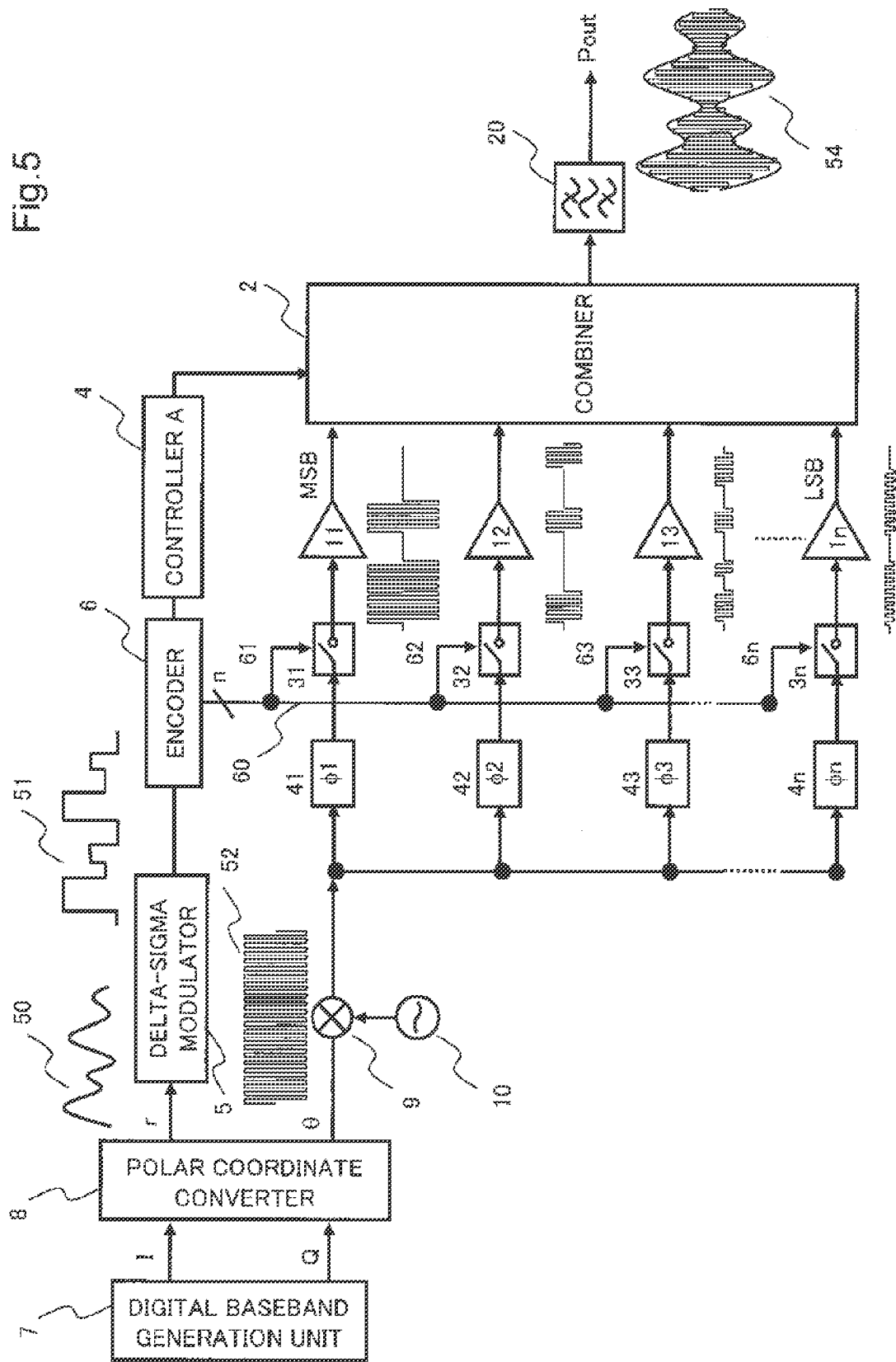
FIG. 5 is a block diagram showing a configuration of a second exemplary embodiment of the present invention.

FIG. 5 is a block diagram showing a configuration of a second exemplary embodiment of the present invention.

A digital baseband generation unit 7 outputs a complex signal (I, Q) of a signal to be transmitted. A polar coordinate converter 8 converts a complex signal (I, Q) into a polar coordinate signal (r, θ) and outputs. A delta-sigma modulator 5 performs multilevel delta sigma modulation on an amplitude signal r 50, and outputs a pulse signal 51 having a plurality of discrete output levels. An encoder 6 converts the plurality of output levels of the pulse signal 51 into the control signal 60 which is a digital signal of n bits and outputs. An MSB which is a most significant bit is inputted as a control signal 61, the next bit is inputted as a control signal 62, the further next bit is inputted as a control signal 63, and an LSB (Least Significant Bit) which is a least significant bit is inputted as a control signal 6n into switches 31, 32, . . . , and 3n sequentially among the control signals 60.

A controller A4 outputs a control signal in accordance with the output from the encoder 6 to a combiner 2.

A local oscillator 10 generates local signals. A multiplier 9 multiplies a phase signal θ and a local signal together and outputs a carrier signal 52 on which the phase signal is superposed. The carrier signal 52 is branched into the same number as the number of bits n of the control signal 60 and the carrier signal 52 are inputted to the switches 31 and 32 . . . and 3n after their phases are rotated by φ1, φ2, . . . , and φn respectively by phase-shifters 41, 42, . . . , and 4n. The switches 31 32, . . . , and 3n switch the carrier signals 52 based on the control signals 61 and 62 . . . 6n from the encoder 6. The switched carrier signals 52 are inputted to power amplifiers 11 and 12 . . . 1n respectively. The power amplifiers 11, 12, . . . , 1n amplify the carrier signals 52 which passed the switches 31, 32, . . . , and 3n, and output.

The combiner 2 combines the outputs from the amplifiers 11, 12, . . . , and 1n without the power loss by controlling the phase inside the combiner based on the signal from the controller A4.

A filter 20 inputs a signal combined in the combiner 2, and passes only a signal around the carrier frequency, and outputs.

(Operation)

Figure 6:
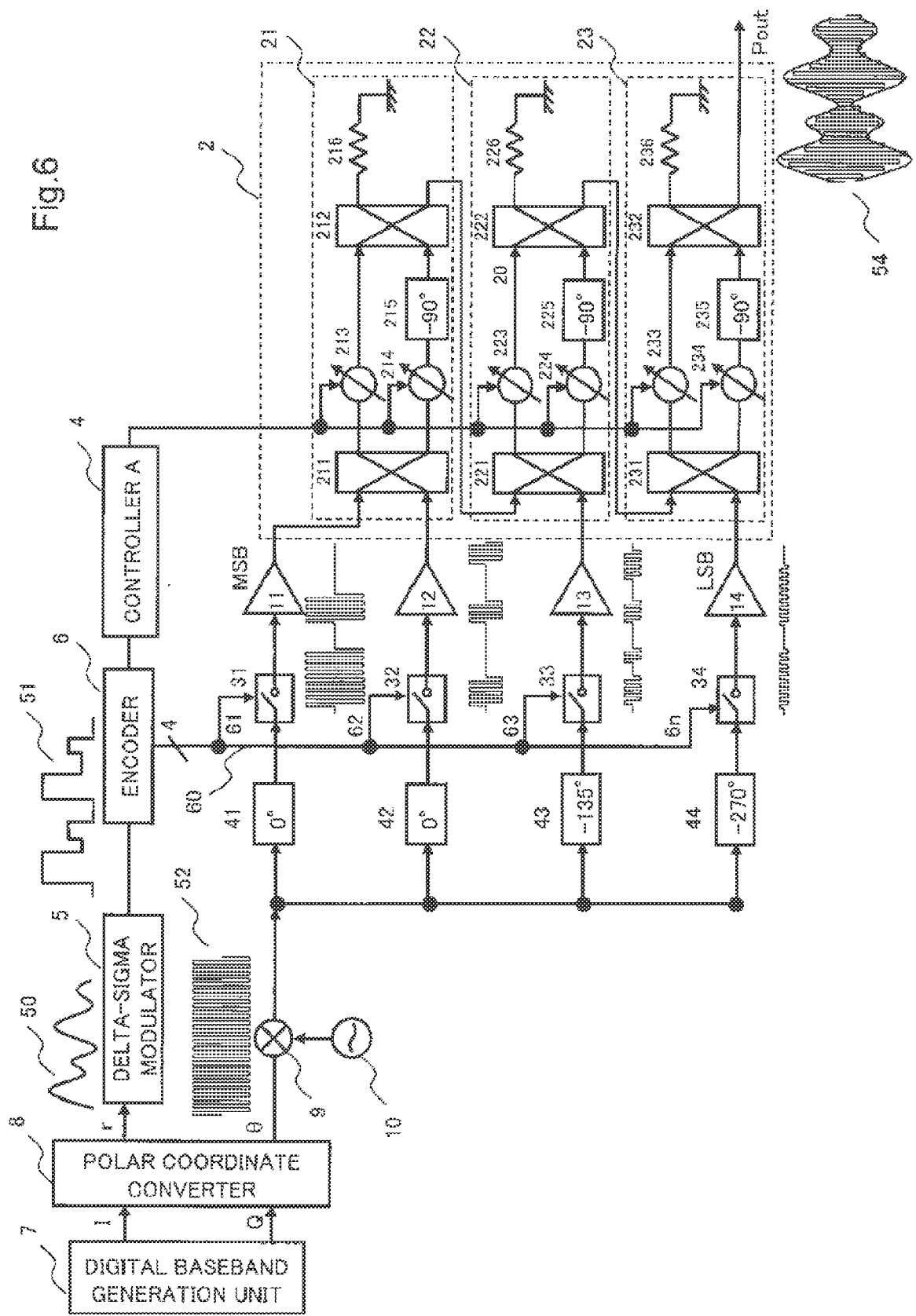
FIG. 6 is a block diagram showing a more specific configuration of the second exemplary embodiment of the present invention.

Next, amplification operation of the power amplification device of FIG. 5 is shown using FIG. 6 which is a more specific configuration of FIG. 5.

FIG. 6 is a block diagram showing a more specific configuration of the second exemplary embodiment of the present invention. Here, for a simplification, although using a case of 4 bits (n=4) is shown, the basic operation is the same for arbitrary bit numbers.

In the diagram, when the amplitude signal r 50 is inputted to the delta-sigma modulator 5, the delta-sigma modulator converts the amplitude signal r 50 into a pulse signal 51 having discrete output levels of $2^4$=16 valued (for example, the intensities of the output levels are 0, 1, . . . , or 15). The encoder 6 converts the discrete output levels of sixteen valued into the control signal 60 which is a digital signal expressed by binary expression and composed of "1" and "0" of 4 bits. The MSB of the control signal 60 is inputted to the power amplifier 11 as the control signal 61. The LSB of the control signals 60 is inputted to the power amplifier 14 as the control signal 64.

After the carrier signals 52 on which the phase signals are superposed are shifted the phases to 0°, 0°, −135° and −270°, respectively by the phase-shifters 41, 42, 43 and 44, the carrier signals 52 are inputted to the switches 31, 32, 33 and 34. The switches 31, 32, 33 and 34 perform an ON and OFF action based on the control signals 61, 62, . . . and 6n, respectively. The switches 31, 32, 33 and 34 pass the carrier signals 52 only during an ON period, and input the carrier signals 52 into the corresponding power amplifiers 11, 12, 13 and 14.

The power amplifiers 11, 12, 13 and 14 have output levels corresponding to the magnitude ($2^3$, $2^2$, $2^1$ and $2^0$) of respective bits of the control signal 60 expressed by binary expression. The power amplifiers 11, 12, 13 and 14 amplify the carrier signals which pass the switches 31, 32, 33 and 34 and output to the combiner 2. For example, the power amplifiers 11, 12, 13 and 14 include class B amplifiers and output signals with output levels corresponding to the magnitude of respective bits. Therefore, the size of the transistor of which the power amplifier 11 is composed is designed so as to set to a ratio of $2^3$, the size of the transistor of which the power amplifier 12 is composed is designed so as to set to a ratio of $2^2$, the size of the transistor of which the power amplifier 13 is composed is designed so as to set to a ratio of $2^1$, and the size of the transistor of which the power amplifier 14 is composed is designed so as to set to a ratio of $2^0$. When transistors of which the power amplifier 11 is composed are FETs, the gate widths are set to 8:4:2:1. When transistors of which the power amplifier 11 is composed are bipolar transistors, the areas of the emitters are set to 8:4:2:1.

For example, when the output level of the pulse signal 51 is "15", as the control signal 60, (1, 1, 1, 1) is outputted. At that time, all switches 31, 32, 33 and 34 are turned on, and the power amplifiers 11, 12, 13 and 14 amplify the carrier signals 52 and output to the combiner 2.

For example, when the output level of the pulse signal 51 is "10", as the control signal 60, (1, 0, 1, 0) is outputted. At that time, only the switches 31 and 33 are turned on, and only the power amplifiers 11 and 13 amplify the carrier signals 52 and output to the combiner 2, and the outputs of the power amplifiers 12 and 14 will be in an opened state.

When the control signal 60 is in the other bit state, similar operation is performed. The power combiner 2 includes a series connection of three basic structures 21, 22 and 23 which combine 4-bit signals.

The first power combiner 21 includes a first 3 dB coupler 211, variable phase-shifters 213 and 214 provided in the respective output paths thereof, a 90° phase-shifter 215 provided in an output of the variable phase-shifter 214 and a variable phase-shifter 213. The first power combiner 21 further includes a second 3 dB coupler 212 which inputs the output from the 90° phase-shifter 215, and a dummy resistor 216. The second power combiner 22 and the third power combiner 23 have the same configurations as the first power combiner 21.

Operation of the power combiner shown in FIG. 6 is described in detail with reference to FIG. 8 below.

Figure 8:
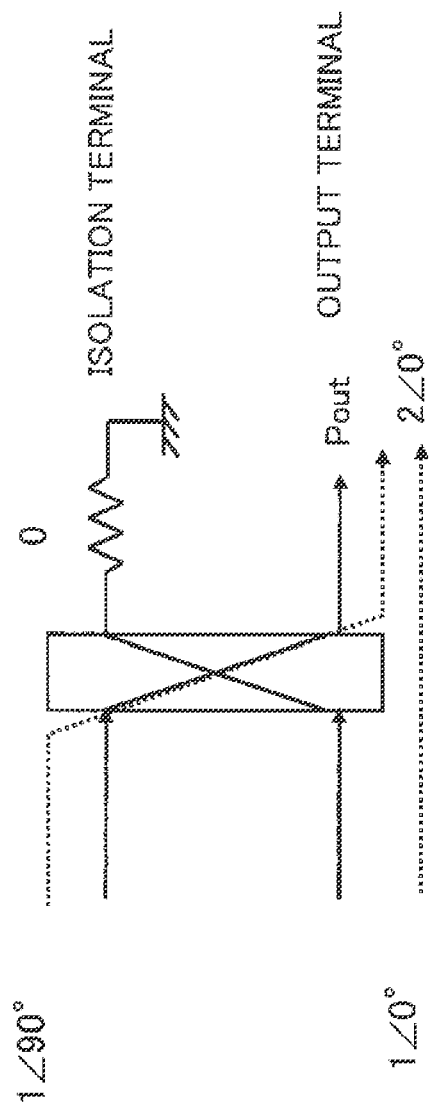
FIG. 8 is a diagram illustrating operation of a 3 dB coupler of an exemplary embodiment of the present invention.

FIG. 8 is a diagram illustrating operation of the 3 dB coupler in the second exemplary embodiment.

When a signal with which 90° phase shifted in equal amplitude is inputted to the 3 dB coupler as shown in FIG. 8, the combined power appears only in an output terminal, and a power is not consumed in the dummy resistor connected to an isolation terminal. That is, the power combining can be performed without a power loss. However, signals of the different amplitudes are generally inputted to the 3 dB couplers according to the bit state of the control signal 60 in the respective power combiners 21, 22 and 23 shown in FIG. 6.

Vector signals (the voltage magnitude∠phase) $(E_1/\sqrt{2})\angle 0$ and $(E_2/\sqrt{2})\angle 0$ of the output voltages of the amplifiers 11 and 12 are inputted to the first 3 dB coupler 211 of the first power combiner 21. The following signals appear in the output terminals of the first 3 dB coupler 211.

$$\frac{E_1}{\sqrt{2}}\angle 0° + \frac{E_2}{\sqrt{2}}\angle -90° = \frac{\sqrt{E_1^2+E_2^2}}{\sqrt{2}}\angle\left\{-\tan^{-1}\left(\frac{E_2}{E_1}\right)\right\}$$
$$= A\angle x°$$

$$\frac{E_1}{\sqrt{2}}\angle -90° + \frac{E_2}{\sqrt{2}}\angle 0° = \frac{\sqrt{E_1^2+E_2^2}}{\sqrt{2}}\angle\left\{-\tan^{-1}\left(\frac{E_1}{E_2}\right)\right\}$$
$$= A\angle y°$$

formula (1)

The phases x° and y° of two signals are shifted by the phase-shifters 213 and 214 to +{(y°−x°)/2} and −{(y°−x°)/2} respectively. As a result, a signal whose amplitude is arranged to the phase $(x°+y°)/2=-45°$ in the equal amplitude $A=(E_1^2+E_2^2)/2)^{0.5}$ is obtained.

The values of x° ($=-\tan^{-1}(E_2/E_1)$) and y° ($=-\tan^{-1}(E_1/E_2)$) are calculated in advance in the controller A4 from the values of the voltage magnitudes $E_1$ and $E_2$, and The values of x° and y° control the phase shift quantities of the variable phase-shifters 213 and 214. The phase-shifter 215 delays the phase of the output signal of the variable phase-shifter 214 (the lower bit side) by 90°.

The outputs from the variable phase-shifter 213 and the phase-shifter 215 become the signals which have the equal amplitude A, and whose phases are shifted by 90° each other. By inputting the signals to the second 3 dB coupler 212, two voltage vectors become a common phase and the equal amplitude, and the following combined power appears in the output terminal thereof.

$$A\angle(-45°-90°)+A\angle-135°=\sqrt{E_1^2+E_2^2}\angle-135°$$ formula (2)

As shown in below, two voltage vectors will be in reverse phases and the equal amplitude in the dummy resistor 216 of the isolation terminal, and a power is not consumed.

$$A\angle-45°+A\angle(-45°-90°)=0$$ formula (3)

formula (1)~formula (3) are established independently of the magnitudes of $E_1$ and $E_2$. Accordingly, the power combiner 21 can combine power according to the arbitrary bit state without a loss.

The combined power of the power amplifiers 11 and 12 indicated by formula (2) is inputted to the first 3 dB coupler 221 of the second power combiner 22. The output from the power amplifier 13 is inputted to other input terminal of the first 3 dB coupler 221 of the second power combiner 22. At that time, the phase-shifter 43 shifts the phase of the carrier signal 52 by −135° in advance in order to match a phase −135° (formula (2)) of a signal from a high order bit. Accordingly, the phases of the signals inputted to the 3 dB coupler via the power amplifier 13 are matched.

As a result, the second power combiner 22 can combine two inputted signals without a loss independently of their magnitudes by the same operating principle indicated in formula (1)~formula (3).

That is, the combined power of the power amplifiers 11, 12 and 13 appears in the output from the second power combiner 22, and because the combined power's phase is further shifted by −135°, then the combined power's phase is shifted by −270° in total.

The combined power of the power amplifiers 11, 12 and 13 is inputted to the first 3 dB coupler 231 of the third power combiner 23. The output of the power amplifier 14 is inputted to other input terminal of the first 3 dB coupler of the third power combiner 23. At that time, the phase-shifter 44 shifts the phase of the carrier signal 52 by −270° in advance in order to match a phase −270° of a signal from a high order bit. Accordingly, the phases of the signals inputted to the 3 dB coupler 231 via the power amplifier 14 are matched.

As a result, the third power combiner 23 can combine two inputted signals without a loss independently of their magnitudes by the same operating principle indicated in formula (1)~formula (3). That is, the combined power of the power amplifiers 11, 12, 13 and 14 appears in the output from the third power combiner 23. The combined signal will be an output signal 54 (Pout) via a filter as necessary.

Thus, the power amplification device of this exemplary embodiment includes a plurality of amplifiers with an amplification degree according to the magnitude of the input signal, and the number of the amplifiers turned on is changed according to the output level. Only amplifiers of requisite minimum operate according to the magnitude of the back off, and a class B amplifier can be operated at around the saturation range in which the power efficiency becomes the maximum. Accordingly, in the power amplification device of this exemplary embodiment, the high efficiency is always maintained.

In this exemplary embodiment, a power combiner based on a 3 dB coupler in which isolation between the ports is secured is used. Therefore, the power amplifier does not need to be a class D switching mode amplifier like the first exemplary embodiment. Accordingly, there is an advantage that an amplifier like class B or class C with easier realization by high frequency can be used. In other words, any, such as class A, class B, class C, class D, class E and class F may be sufficient as a power amplifier which composes the power amplification device shown in FIG. 5.

Figure 11:
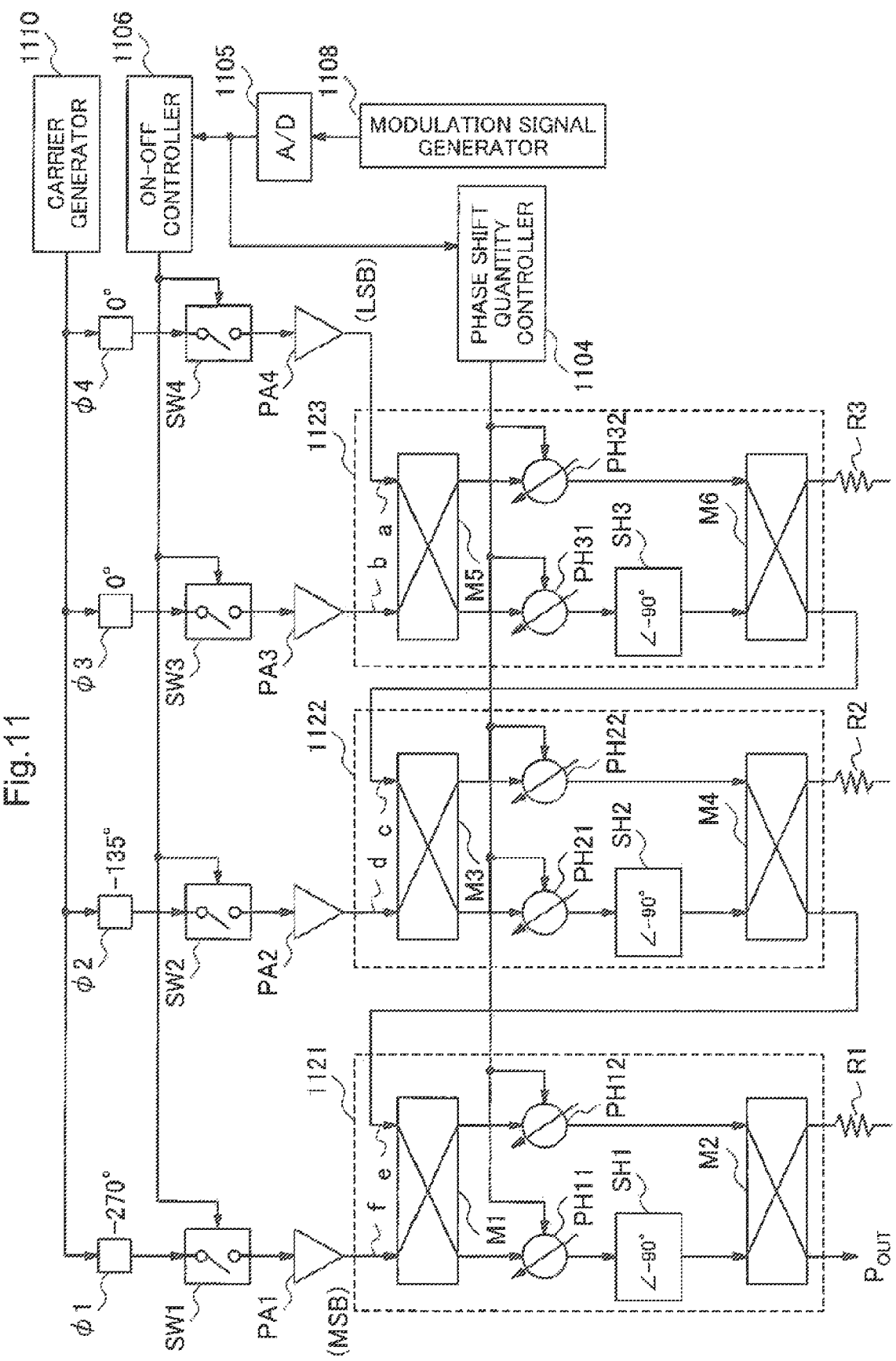
FIG. 11 is a block diagram showing a configuration of an amplifier of a digital modulation system which is another related art.

In the power amplification device of the related technology shown in FIG. 11, the intensity of the amplitude signal is expressed by only the numbers of the power amplifiers which are turned on. In contrast, according to the above-mentioned exemplary embodiment, a multilevel delta sigma modulation having a plurality of discrete output levels is performed on an amplitude signal by a multilevel delta sigma modulator. The delta-sigma modulator has the effect that the quantization noise level around the desired signal is lowered by applying oversampling to an input signal. Moreover, the delta-sigma modulator has the noise shaping effect that distributes quantization noise over a bandwidth which is separated from a desired signal. As a result, the SN ratio equal to the related technology can be realized by the number (=number of bits) of the power amplifiers less than the related technology. The reason is as follows. That is, in the power amplifier of the related technology which does not use a delta-sigma modulator, the amplitude signal is expressed only by the height of the pulse (=the number of the power amplifiers which operate). In contrast, in the above-mentioned exemplary embodiment, the amplitude signal is expressed by using a width of a pulse (=an operating time of a power amplifier) in addition to the height of the pulse. Therefore, the number of the power amplifiers which operate is reduced by the part thereof.

A finite loss exists in a 3 dB coupler or a phase-shifter of which a power combiner is composed. Because these are connected in series in a power combining unit, a loss is added. However, according to this exemplary embodiment, because the number of the required power amplifiers can be reduced, power loss by a power combiner can also be reduced.

That is, to achieve the high SN ratio and the high power efficiency by this exemplary embodiment is possible.

This exemplary embodiment has the effect that the oversampling frequency can be lowered by having multilevel delta sigma modulation, and realization of a device is facilitated.

In this exemplary embodiment, because the oversampling frequency can be lowered by having multilevel delta sigma modulation, an average switching frequency of a switching amplifier is also lowered. Accordingly, the effect that a degradation of the power efficiency of the switching amplifier can be suppressed is obtained.

Note that the functions of the polar coordinate converter 8, the delta-sigma modulator 5, and the encoder 6 shown in FIG. 5 and FIG. 6 may be composed as an individual block. Or these functions may be integrated to compose as a part of the digital baseband generation unit 7. In this case, the amplitude signal 50 and the pulse signal 51 which is an output signal of the multilevel delta-sigma modulator are also expressed as digital signals.

Although the 1st order is assumed as the order of the delta-sigma modulator in this exemplary embodiment, the order of no smaller than 2nd can be selected arbitrarily according to the system.

In this exemplary embodiment, although the output levels of the power amplifiers 11 and 12 . . . and 1$n$ are given weight by $2^{n-1}$, $2^{n-2}$, . . . and $2^0$, the coding method with the encoder 6 and the weighting for each amplifier can be designed freely according to the system.

(The Third Exemplary Embodiment)

(Configuration)

Next, a configuration of a receiving apparatus of a third exemplary embodiment will be described.

Figure 7:
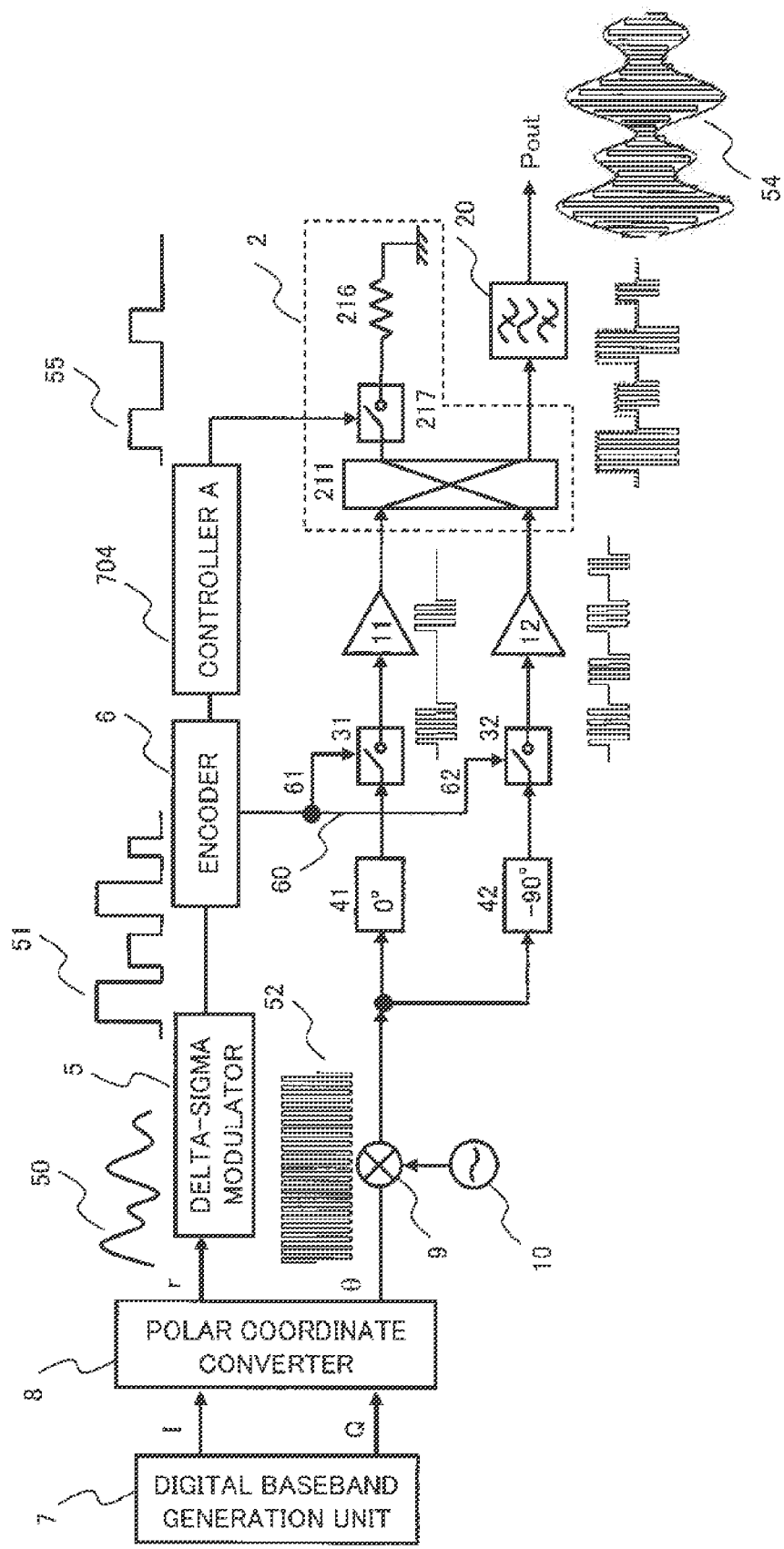
FIG. 7 is a block diagram showing a configuration of a third exemplary embodiment of the present invention.

FIG. 7 is a block diagram showing a configuration of a third exemplary embodiment of the present invention.

Although the case where the number of power amplifiers is four is shown in the second exemplary embodiment, the number of power amplifiers is reduced to two in this third exemplary embodiment.

A digital baseband generation unit 7 outputs a complex signal (I, Q) of a signal to be transmitted. A polar coordinate converter 8 converts a complex signal (I, Q) into a polar coordinate signal (r, θ) and outputs. A delta-sigma modulator 5 performs multilevel delta sigma modulation on an amplitude signal r 50, and outputs a pulse signal 51 having discrete output levels of three valued. An encoder 6 converts discrete output levels of three valued of the pulse signal 51 into a control signal 60 which is a digital signal of 2 bits, and outputs. An MSB of the control signal 60 is inputted as a control signal 61 to a switch 31, and an LSB thereof is inputted as a control signal 62 to a switch 32.

A controller B 704 outputs a control signal corresponding to the output from the encoder 6 to a combiner 2.

A local oscillator 10 generates local signals. A multiplier 9 multiplies a phase signal θ and a local signal together and outputs a carrier signal 52 on which the phase signal is superposed. The carrier signal 52 is branched into two, and The carrier signal 52 are inputted to switches 31 and 32 after rotating their phases by only 0° and −90° in phase-shifters 41 and 42 respectively. The switches 31 and 32 switch the carrier signal 52 based on the control signals 61 and 62 from the encoder. The switched carrier signals 52 are inputted to power amplifiers 11 and 12 respectively. The power amplifiers 11 and 12 amplify the carrier signals 52 which passed the switches 31 and 32, and output.

The combiner 2 combines the outputs from the amplifiers 11 and 12 without a power loss by controlling the switch 217 inside the combiner based on the control signal from the controller B 704, and outputs.

A filter 20 inputs a signal combined in the combiner 2, and passes only a signal around the carrier frequency, and outputs only the signal around the carrier frequency. Details of the delta-sigma modulator 5 shown in FIG. 7 are same as one shown in FIG. 4.

(Operation)

Next, amplification operation of the power amplification device of FIG. 7 is shown.

In the diagram, the amplitude signal r 50 is inputted to the delta-sigma modulator 5. The delta-sigma modulator converts the amplitude signal r 50 into the pulse signal 51 having discrete output levels of three valued. Discrete output levels of three valued means that the output levels turn into three values, 0, 1 or 2, for example. The encoder 6 converts discrete output levels of three valued into the control signal 60 which is a digital signal of 2 bits.

After the carrier signals 52 on which the phase signals are superposed are shifted the phases to 0° and −90°, respectively by the phase-shifters 41 and 42, the phase-shifted carrier signals are inputted to the switches 31 and 32. The phase shift 0° means that the phase is not shifted. The switches 31 and 32 perform ON or OFF operation based on the control signal 60. The switches 31 and 32 pass the carrier signals 52 only during an ON period, and input the carrier signals 52 into the corresponding power amplifiers 11 and 12.

The power amplifiers 11 and 12 have the same output level, and amplify the carrier signals which passed the switches 31 and 32, and output to the combiner 2. For example, the power amplifiers 11 and 12 include a class B amplifier with the same size.

When an output level of the pulse signal 51 is "2", the control signal 60 outputs (1, 1). At that time, the switches 31 and 32 are set to ON together, and the power amplifiers 11 and 12 amplify the carrier signals 52 and output to the combiner 2.

When an output level of the pulse signal 52 is "1", the control signal 60 outputs (0, 1). At that time, only the switch 32 is set to ON, and amplifies only the carrier signal 52 of the power amplifier 12, and outputs to the combiner 2, and the output of the power amplifier 11 will be in an opened state.

When an output level of the pulse signal 52 is "0", the control signal 60 outputs (0, 0). At that time, the switches 31 and 32 are set to OFF together, and the outputs of the power amplifiers 11 and 12 are in an opened state and do not output signals.

In this configuration, the output levels are three valued, and the output levels can be expressed by three ways that both switches 31 and 32 are turned off, either switches 31 or 32 is turned on, and both are turned on. Accordingly, a case when the control signal 60 is (1, 0) is unnecessary.

When the output level of the pulse signal 51 is "2", that is, the control signal 60 is (1, 1), the controller B704 outputs a control signal of "High", and otherwise, outputs a control signal of "Low".

Figure 9A:
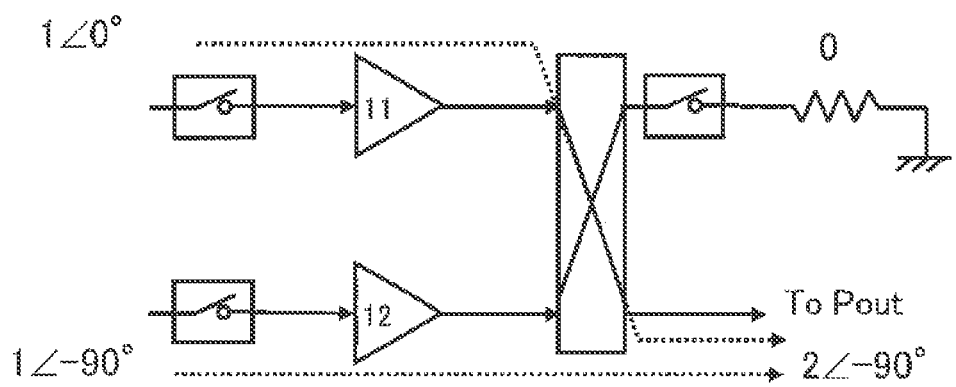
FIG. 9A is a diagram illustrating operation of a power combiner of an exemplary embodiment of the present invention.

The combiner 2 includes a 3 dB coupler 211, a switch 217 and a dummy resistor 216. When the control signal is in "High", the switch 217 is turned on, and the combiner 2 operates as a usual 3 dB coupler as shown in FIG. 9A. The signals whose phases are shifted to 90° each other in the equal amplitude dare inputted from the amplifiers 11 and 12. Accordingly, a power does not appear in the dummy resistor 216, and the power that combined the output power from two amplifiers is outputted. That is, power combining can be performed without a power loss.

Figure 9B:
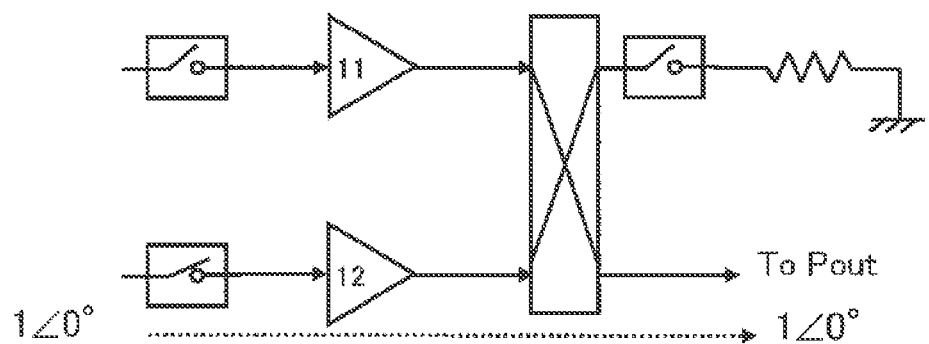
FIG. 9B is a diagram illustrating operation of a power combiner of an exemplary embodiment of the present invention.

When the output level of the pulse signal 51 is "1", a control signal outputs "Low". As shown in FIG. 9B, when the control signal is "Low", the switch 217 is turned off, and the output signal of the power amplifier 12 is directly outputted.

Thus, the power amplification device of this exemplary embodiment includes two amplifiers with the equal output power, and the number of the amplifiers turned on is changed according to the output level. Because only one amplifier operates when the output level is small, high efficiency can be maintained compared with the case when a class B amplifier is used independently.

In this exemplary embodiment, a power combiner based on a 3 dB coupler in which isolation between the ports is secured is used. Accordingly, the power amplifier does not need to be a class D switching mode amplifier like the first exemplary embodiment. Accordingly, there is an advantage that an amplifier like class B or class C with easier realization can be used. In other words, any, such as class A, class B, class C, class D, class E and class F may be sufficient as a power amplifier which composes the power amplification device shown in FIG. 7.

Although the intensity of the amplitude signal is expressed by only the numbers of the power amplifiers which are turned on in the power amplification device of the related technology shown in FIG. 11, a multilevel delta sigma modulation having three values of discrete output levels is performed on an amplitude signal in this exemplary embodiment.

The delta-sigma modulator has the effect that the quantization noise level around the desired signal is lowered by applying oversampling to an input signal. Moreover, the delta-sigma modulator has the noise shaping effect that distributes quantization noise over a bandwidth separated from a desired signal.

As a result, the SN ratio equal to the related technology can be realized by the number of the power amplifiers (=number of bits) less than the related technology. The reason is as follows. That is, in the power amplifier of the related technology which does not use a delta-sigma modulator, the amplitude signal is expressed only by the height of the pulse (=the number of the power amplifiers which operate). In contrast, the amplitude signal is expressed by using a width of a pulse (=an operating time of a power amplifier) in addition to the height of the pulse in the above-mentioned exemplary embodiment.

That is, to achieve the high SN ratio and the high power efficiency by this exemplary embodiment is possible.

This exemplary embodiment has the effect that the oversampling frequency can be lowered by having multilevel delta sigma modulation, and realization of a device is facilitated.

In this exemplary embodiment, because the oversampling frequency can be lowered by having multilevel delta sigma modulation, an average switching frequency of a switching amplifier also falls. Accordingly, the effect that a fall of the power efficiency of the switching amplifier can be suppressed is obtained.

Note that the functions of the polar coordinate converter 8, the delta-sigma modulator 5, and the encoder 6 shown in FIG. 5 and FIG. 6 may be composed as an individual block. Or these functions may be integrated to compose as a part of the digital baseband generation unit 7. In this case, the amplitude signal 50 and the pulse signal 51 which is an output signal from the multilevel delta-sigma modulator are also expressed as digital signals.

Although the one order is assumed as the order of the delta-sigma modulator in this exemplary embodiment, the order thereof can be selected arbitrarily according to the system.

(The Fourth Exemplary Embodiment)

Next, a fourth exemplary embodiment for carrying out the present invention will be described.

Figure 12:
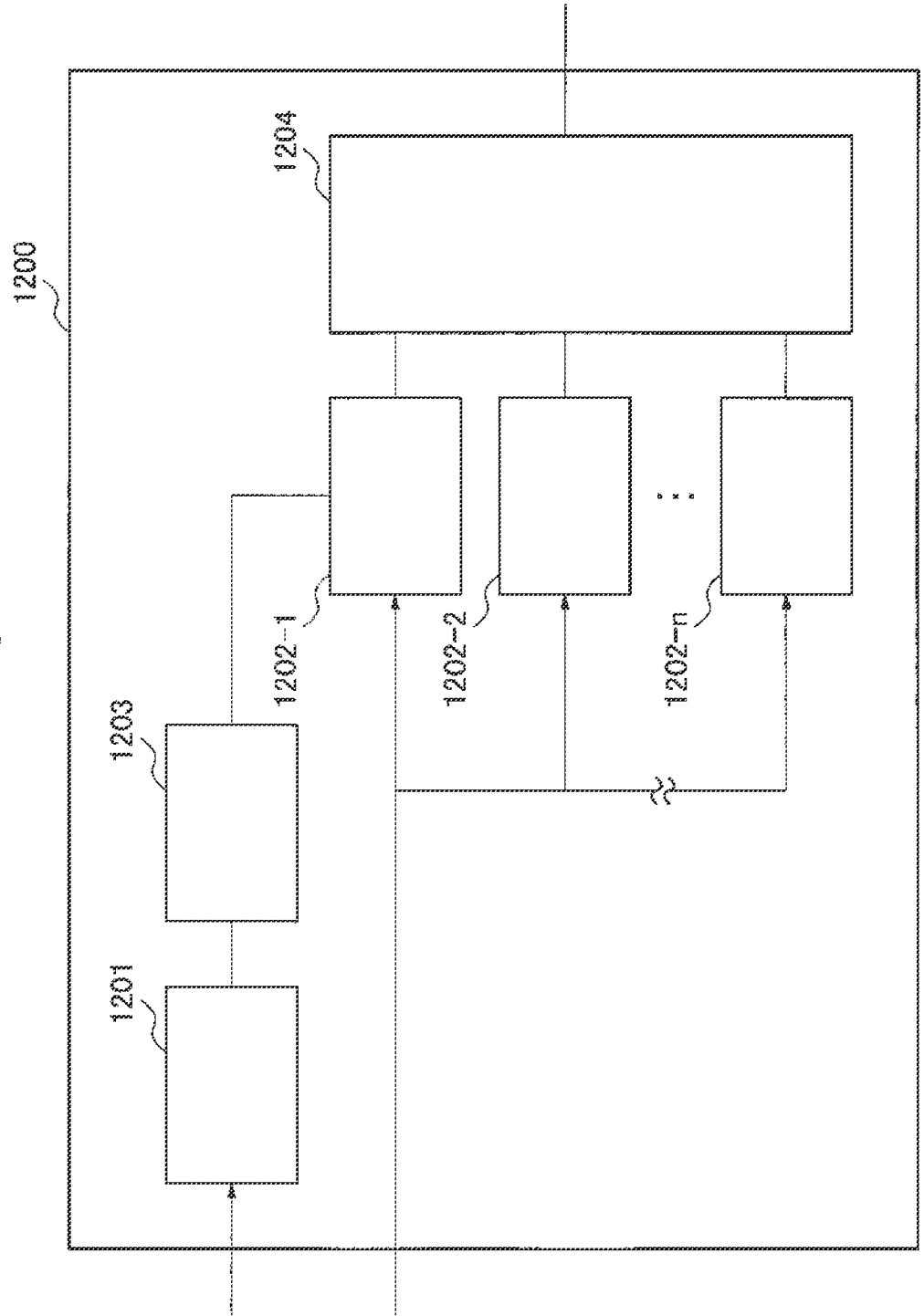
FIG. 12 is a block diagram showing a configuration of a fourth exemplary embodiment of the present invention.

A configuration of a power amplifier of a fourth exemplary embodiment is shown in FIG. 12.

A power amplification device 1200 of a third exemplary embodiment includes a delta-sigma modulator 1201 which performs a multilevel delta sigma modulation on an amplitude signal of an input signal and a plurality of power amplifier 1202-1-1202-$n$ which amplify carrier signals.

The power amplification device 1200 further includes an encoder 1203 which generates a first control signal that controls ON/OFF of the output from a plurality of power amplifiers in accordance with the output from the delta-sigma modulator.

The power amplification device 1200 further includes a combiner 1204 which combines any at least two power output from the plurality of power amplifiers based on the first control signal.

In this exemplary embodiment, the effect described below is exerted.

According to this exemplary embodiment, a power amplification device which has high power efficiency for an input signal even in a region in a large back-off and can also suppress increasing of power consumption in high-speed communication can be provided.

Although the present invention has been described with reference to the exemplary embodiments above, the present invention is not limited to the exemplary embodiment mentioned above. The various changes which a person skilled in the art can understand in the scope of the present invention can be performed in the composition and its details of the present invention.

This application claims priority based on Japanese Patent Application No. 2011-208259, filed on Sep. 23, 2011, the disclosure of which is hereby incorporated by reference in its entirety.

INDUSTRIAL APPLICABILITY

The present invention relates to a feedback amplifier circuit and a high speed semiconductor integrated circuit in particular which processes wide bandwidth data signals and has the availability on the industry.

REFERENCE SIGN LIST 11, 12 power amplifier
1$a$, 1$b$, 1$c$, 1$d$ FET
111, 112, 113, 114 switch
2 power combiner
21 transformer 31 switch
41 phase-shifter
4 controller A
704 controller B
5 delta-sigma modulator
6 encoder
7 digital baseband generation unit
8 polar coordinate converter
9 multiplier
10 local oscillator
20 filter
50 amplitude signal
51 pulse signal
52 carrier signal
54 output signal
60 control signal
61, 62, 6n control signal
211, 221, 231, 212 3 dB coupler

The invention claimed is:

1. A power amplification device comprising:
a polar coordinate converter which separates an input signal which is a complex signal into an amplitude signal and a phase signal;
a delta-sigma modulator which performs a multilevel delta sigma modulation on the amplitude signal of the input signal separated by said polar coordinate converter;
a plurality of power amplifiers which amplify carrier signals;
an encoder which generates a first control signal that controls ON/OFF of the outputs from said plurality of power amplifiers in accordance with the output from said delta-sigma modulator; and
a combiner which combines at least two power outputs from said plurality of power amplifiers in accordance with said first control signal,
wherein said carrier signal is obtained from a product of a signal from a local oscillator and said phase signal of the input signal separated by said polar coordinate converter.

2. The power amplification device according to claim 1, wherein
said output from said delta-sigma modulator is discrete output levels of $2^n$ (for n, natural number),
said first control signal is a digital signal of n bits that is converted the discrete output levels into a binary code,
said plurality of power amplifiers are included n pieces,
said n pieces of power amplifiers have n kinds of output power proportional to $2^{n-1}, 2^{n-2}, \ldots, 2^1$ and $2^0$ respectively, and
said n pieces of power amplifiers output signals only during a period that a bit state corresponding to said first control signal is "1" (logical High).

3. The power amplification device according to claim 1, wherein
said power amplifier is a class D switching mode amplifier, and
said combiner includes a plurality of coil transformers, each of which corresponds to one of said power amplifiers, and a secondary coil of each coil transformer is connected in series.

4. The power amplification device according to claim 3, wherein number of turns of said coil transformer corresponds to weighting on an output voltage from said corresponding power amplifier.

5. The power amplification device according to claim 2, further comprising:

a plurality of phase-shifters, each of which corresponds to one of said power amplifiers and shifts a phase of said carrier signal inputted to the corresponding power amplifier;
a plurality of switches, each of which corresponds to one of said phase-shifters and switches said carrier signal from the corresponding phase shifter ON and OFF based on the first control signal; and
a first controller which generates a second control signal, which controls variable phase-shift in the process of said combiner, in accordance with the output from said delta-sigma modulator,
wherein
said combiner includes a plurality of unit combiners, in which a first unit combiner combines outputs from two power amplifiers corresponding to adjacent two higher bits and each of the subsequent unit combiners combines an output from a preceding unit combiner and an output from the power amplifier corresponding to a next lower bit,
wherein said unit combiner includes:
a first 3 dB coupler which inputs signals from the two power amplifiers, or inputs signals of an output from a preceding unit combiner and an output from the power amplifier corresponding to a next lower bit;
two variable phase-shifters which control a phase difference of two output signals from said first 3 dB coupler so that the phase difference may become a common phase based on said second control signal; and
a second 3 dB coupler which inputs an output signal from one of said two variable phase-shifters corresponding to a higher bit, inputs an output signal from another variable phase-shifter corresponding to a lower bit after −90° phase shifting is performed, and outputs a combined signal to a unit combiner of a subsequent stage corresponding to a next lower bit, and
wherein output power from the plurality of said power amplifiers to which said carrier signals that passed the switches based on the first control signal are inputted are combined.

6. The power amplification device according to claim 1, wherein said output of said delta-sigma modulator has three values of discrete values, and said plurality of power amplifiers are included two pieces, and each of the power amplifiers have the same output power,
wherein said power amplification device further comprises:
two phase-shifters, each of which corresponds to one of said two power amplifiers, and shift phases of said carrier signals inputted to the corresponding power amplifier;
two first switches, each of which corresponds to one of said two phase-shifters, and switch the carrier signals from the corresponding phase shifter ON and OFF based on said first control signal so that both of the first switches may be ON when the output level of said delta-sigma modulator is the maximum value of the three values, one of the first switches may be ON when the output level is an intermediate value of the three values, and otherwise, both of the first switches may be OFF; and
a second controller which generates a third control signal, which controls switching operation in the process of said combiner, in accordance with the output from said delta-sigma modulator, and wherein said combiner includes:
- a 3 dB coupler to which output signals from said two power amplifiers are input; and
- a second switch connected between an isolation terminal of said 3 dB coupler and a dummy resistor, and switches based on the third control signal so that the second switch may be ON when the output level of said delta-sigma modulator is the maximum value, and otherwise, the second switch may be OFF, wherein said 3 dB coupler combines output power from both of said two power amplifiers and outputs when the output level of said delta-sigma modulator is the maximum value, and outputs output power from one of said two power amplifiers as it is when the output level of said delta-sigma modulator is the intermediate value of the three values.

7. The power amplification device according to claim 5, wherein power supply voltages of the plurality of said power amplifiers correspond to weighting of the output voltages from said power amplifiers.

8. A power amplification method comprising:

separating an input signal which is a complex signal into an amplitude signal and a phase signal;

obtaining a carrier signal from a product of a signal from a local oscillator and said separated phase signal of the input signal;

performing multilevel delta-sigma modulation on the separated amplitude signal of the input signal;

generating a control signal that controls ON/OFF of the outputs from said plurality of power amplifiers in accordance with the output from said delta-sigma modulation;

controlling, in a plurality of power amplifiers which amplify carrier signals, ON/OFF of the outputs based on said control signal, and combining at least two power output from the plurality of said power amplifiers.

* * * * *